US010781297B2

(12) United States Patent
Liao et al.

(10) Patent No.: US 10,781,297 B2
(45) Date of Patent: Sep. 22, 2020

(54) THERMOSETTING RESIN COMPOSITION

(71) Applicant: NAN YA PLASTICS CORPORATION, Tapei (TW)

(72) Inventors: Te-Chao Liao, Taipei (TW); Ying-Te Huang, Taipei (TW); Hao-Sheng Chen, Taipei (TW); Hung-Yi Chang, Taipei (TW); Chia-Lin Liu, Taipei (TW)

(73) Assignee: Nan Ya Plastics Corporation, Taipei (TW)

( * ) Notice: Subject to any disclaimer, the term of this patent is extended or adjusted under 35 U.S.C. 154(b) by 270 days.

(21) Appl. No.: 15/834,259

(22) Filed: Dec. 7, 2017

(65) Prior Publication Data
US 2018/0163023 A1 Jun. 14, 2018

(30) Foreign Application Priority Data

Dec. 13, 2016 (TW) .............................. 105141169 A

(51) Int. Cl.
C08K 5/5333 (2006.01)
H05K 1/09 (2006.01)
C08K 3/36 (2006.01)
C08J 5/24 (2006.01)
B32B 15/14 (2006.01)
B32B 17/04 (2006.01)
B32B 15/20 (2006.01)
C08L 71/12 (2006.01)
C08K 3/22 (2006.01)
C08K 5/20 (2006.01)
C08K 5/3492 (2006.01)
C08K 5/52 (2006.01)
C08K 3/26 (2006.01)
C08K 5/523 (2006.01)
C08K 5/02 (2006.01)

(52) U.S. Cl.
CPC ............ C08K 5/5333 (2013.01); B32B 15/14 (2013.01); B32B 15/20 (2013.01); B32B 17/04 (2013.01); C08J 5/24 (2013.01); C08K 3/36 (2013.01); C08L 71/12 (2013.01); C08L 71/126 (2013.01); H05K 1/09 (2013.01); C08K 5/02 (2013.01); C08K 5/20 (2013.01); C08K 5/34922 (2013.01); C08K 5/523 (2013.01); C08K 5/5205 (2013.01); C08K 2003/222 (2013.01); C08K 2003/2224 (2013.01); C08K 2003/2227 (2013.01); C08K 2003/2241 (2013.01); C08K 2003/265 (2013.01); C08L 2205/02 (2013.01)

(58) Field of Classification Search
CPC ......... B32B 15/14; B32B 17/04; B32B 15/20; H05K 1/09; C08J 5/24; C08K 3/22; C08K 5/0066
USPC ........................................................ 524/119
See application file for complete search history.

(56) References Cited

U.S. PATENT DOCUMENTS

| 9,293,670 | B2 | 3/2016 | Toita et al. | |
| 10,023,707 | B2 | 7/2018 | Liao et al. | |
| 2012/0065306 | A1* | 3/2012 | Goda | C08L 51/00 524/101 |
| 2015/0105505 | A1* | 4/2015 | He | C08K 5/5313 524/119 |
| 2016/0185904 | A1 | 6/2016 | Gao et al. | |
| 2017/0164469 | A1 | 6/2017 | Kitai et al. | |
| 2017/0223843 | A1* | 8/2017 | Kawakami | C08J 5/24 |

FOREIGN PATENT DOCUMENTS

| CN | 105399946 A | | 3/2016 |
| CN | 105612204 A | | 5/2016 |
| JP | 2009029928 A | | 2/2009 |
| JP | 2016028885 A | | 3/2016 |
| WO | 2015133513 A1 | | 9/2015 |
| WO | WO 2015/133513 | * | 9/2015 |

* cited by examiner

Primary Examiner — Doris L Lee
(74) Attorney, Agent, or Firm — Rosenberg, Klein & Lee

(57) ABSTRACT

A thermosetting resin composition contains a primary resin formed from mixing a styrene-type polyphenylene ether resin thermally modified with styrene with an acrylic-type polyphenylene ether resin thermally modified with acrylic at a weight ratio ranging between 0.5 and 1.5, consequently having excellent heat resistance, flowability, and filling ability; and when cured, having a dielectric constant smaller than 3.0 and a dielectric dissipation factor smaller less than 0.0020 at the frequency of 1 GHz as well as a glass transition temperature higher than 210° C.; in application, the composition is suitable to impregnate reinforcement to form prepregs with excellent curability.

12 Claims, No Drawings

THERMOSETTING RESIN COMPOSITION

BACKGROUND OF THE INVENTION

1. Field of the Invention

The present invention relates to thermosetting resin compositions, and more particularly to a thermosetting resin composition whose composition contains a thermosetting polyphenylene ether resin with a staggered structure.

2. Description of Related Art

In addition to being inexpensive, epoxy resins are highly insulating and chemical-resistant when cured and therefore have been extensively used as the insulating layer material of the conventional printed circuit boards.

In recent years, however, the rapid advancement of high-frequency and broadband communication devices and equipment, the doubling of signal transmission rate and data processing loads, and the trend toward high-density electronic equipment and electronic assemblies have driven the development of printed circuit boards toward even finer lines, smaller line pitches, higher layer count, smaller board thicknesses and less halogenated ingredients such that epoxy resins are becoming inadequate in terms of electrical performance, water absorbency, flame retardancy, dimension stability, and so on.

U.S. Pat. No. 5,221,568 discloses a moldable thermosetting composition for use in a circuit board, which is made from a polybutadiene or polyisoprene resin which is a liquid at room temperature and which has a molecular weight less than 5,000 and a solid butadiene- or isoprene-containing thermoplastic elastomer. This known composition requires high-temperature curing (i.e., at a heat press temperature greater than 250° C.), and when used to make copper clad laminates, is adverse to continuous automated production due to the high viscosity of polybutadiene. Besides, since polybutadiene is highly flammable, an increased amount of flame retardants has to be added, to meet the requirements of UL-94V0.

Compared with epoxy resins, polyphenylene ether (PPE) resins better meet the insulating material requirements of circuit boards, thanks to their excellent insulating abilities, acid resistance, base resistance, small dielectric constants (Dk), and low dielectric dissipation factor (Df). Nevertheless, commercially available PPE resins have problem being directly applied to circuit board production because they are mostly thermoplastic, have overly high molecular weights (with number-average molecular weights greater than 20,000), and are neither easily soluble in solvents nor readily compatible with epoxy resins. Many research and development efforts have been made to overcome the foregoing drawbacks of PPE resins, with a view to modifying PPE resins into curable, more compatible, and more workable resin materials while preserving their outstanding electrical properties.

U.S. Pat. No. 7,858,726 applies molecular weight redistribution to the conversion of a high-molecular-weight PPE resin into a low-molecular-weight PPE resin. While the resulting resin has higher solubility than before the conversion, the hydroxyl groups at the terminal ends of the molecule chain are polar groups which, though hardenable, may increase dielectric loss. Furthermore, as the number of hydroxyl groups of each PPE molecule is on average less than 2, the percentage of active groups that allow hardening is insufficiently low, and a low crosslinking density follows. If insufficient active groups lead to inadequate crosslinking after hardening, heat resistance will be impaired.

U.S. Pat. No. 7,141,627 mentions the drawbacks of hardening with hydroxyl groups. Although hydroxyl groups can serve as the active groups for hardening, an exceedingly large number of hydroxyl groups may undergo incomplete reaction during the hardening process, and the residual hydroxyl groups will lead to high dielectric loss and excessive water absorbency of the hardened board. As such, hardening with hydroxyl groups provides little, if any, improvement on the electrical properties and water absorbency of a material that demands a small dielectric constant and low dielectric loss.

US Patent Application Publication No. 2014/0255711 discloses a polyphenylene ether resin that is terminally modified into an unsaturated group and co-cured with bismaleimide, being advantageous for shortened gel time. In an example, the resin is made of a polyphenylene ether compound that contains styryl groups. While this results in increased heat resistance, flowability during heat curing is nevertheless compromised due to rigidity caused by the styryl groups. In addition, bismaleimide is usually less soluble and tends to separate during processing, leading to dispersion-related problems.

WO 2015/054626 A1 discloses a resin composition, which includes polyphenylene having any low electronegative end group including, but not limited to OH, methacrylate or acrylate with methacrylate being a preferred end group. The OH end group has relatively polarity, which results in increased water absorbency and is thus adverse to the electrical properties of the composition. While the acrylate group does provide a relatively soft structure to contribute to flowability favorable to curing, it fails to provide desired heat resistance, flame retardancy, and mechanical strength. For example, US Patent Application Publication No. 2014/141188 discloses a halogen-free flame retardant resin, composition including an acrylic resin, with the attempt to improve the acrylic resin in flame retardancy.

Journal of Polymer Science (Vol. XI, No. 5, p. 491-506, 1953) teaches that styrene is structurally stable and has relatively high reactivation energy, so is stable in heat, whereas acrylic has relative low structural reactivation energy, and is subject to decomposition in heat.

More particularly, in the prior art, U.S. Pat. No. 5,223,568 using a polybutadiene resin has shortcomings about less control to processing conditions and low flaw resistance of the polybutadiene resin. To make the flare resistance acceptable, an increased amount of flame retardants has to be added. However, the increased amount of flame retardants can bring about adverse effects to other crucial physical properties and leads to low heat resistance, low glass transition temperature (Tg), and high electricity.

Polyphenylene ether structurally contains a large amount of benzene rings and is more stable and more resistant to flame as compared to the polybutadiene resin. In view of this, U.S. Pat. No. 7,858,726 uses a low-molecular polyphenylene ether to address the problem related to poor solubility. However, it has inferior heat resistance. By terminally modifying the low-molecular polyphenylene ether to make it a thermosetting polyphenylene ether resin containing particular functional groups, it when cured in heat curing has higher cross-linking level and better heat resistance, thus extending its applications.

U.S. Pat. No. 7,141,627 teaches a thermosetting, polyphenylene ether resin terminated with a hydroxyl group. However, polar groups can disadvantageously occur during its curing and degrade the cured boards in terms of dielectric constant and dielectric dissipation factor. Besides, the increased water absorbency increases the risk of board popcorn and is adverse to its heat resistance.

Nevertheless, according to researches, when a thermosetting polyphenylene ether resin has its end group modified with a non-polar group (such as an unsaturated allyl or alkynyl group) and then is subject to heat curing, there is no polar group generated during curing, and of course there is no polar group remaining after curing, thus helping to lower valences of dielectric constants (Dk) and dielectric dissipation factor (Df), and to decrease water absorbency.

When a thermosetting polyphenylene ether resin further has its end group modified with an acrylic group, which is a non-polar group, there is no polar group formed either during or after curing, and the product has better electrical properties and lower water absorbency. However, the acrylic group contains hydrocarbon chains and is structurally soft. While it shows better flowability during heat curing, as taught by Journal of Polymer Science (Vol. XI, No. 5, p. 491-506, 1953), hydrocarbon chains are less stable and tend to decompose in heat, meaning that it is less resistant to heat.

Also according to researches, when a polyphenylene ether resin further has its end group modified with a styryl group, which is also a non-polar group, which is a non-polar group, there is no polar group formed either during or after curing, and the product has better electrical properties and lower water absorbency. In addition, the styryl group contains benzene rings and is structurally rigid. Due to electron resonance effects, it has high structural stability and high heat resistance. It is however disadvantageous for poor flowability during heat curing. Particularly, when used in thick copper (2 oz or more) laminates made through a press process, its low flowability can lead to poor resin filling.

SUMMARY OF THE INVENTION

For addressing the foregoing problems, the primary objective of the present invention is to provide a thermosetting resin composition, which contains a polyphenylene ether resin and more non-polar unsaturated functional groups in its chemical structure. In the most preferred structure of the composition, there is a curable, unsaturated, reactive functional group at the end of the main chain of the polyphenylene ether resin, and there is no polar group, so as to significantly decrease dielectric constant (Dk), dielectric dissipation factor (Df), and water absorbency.

Another objective of the present invention is to provide a thermosetting resin composition, its primary resin is a thermosetting polyphenylene ether resin composition, and contains a styrene-based polyphenylene ether resin and an acrylic-based polyphenylene ether resin that are combined in a certain ratio. As to properties, it displays good flowability and heat resistance by preserving good heat resistance of acrylic and improving flowability of styrene.

Another objective of the present invention is to provide a thermosetting resin composition containing the following components (a)-(e), based on a solid content of the resin composition:
(a) a thermosetting polyphenylene ether resin, accounting for 35-60 wt %, and formed from mixing a styrene-type polyphenylene ether resin with an acrylic-type polyphenylene ether resin at a weight ratio of the styrene-type polyphenylene ether resin to the acrylic-type polyphenylene ether resin ranged between 0.5 and 1.5;
(b) inorganic powder, accounting for 20-50 wt %;
(c) a flame retardant, accounting for 5-25 wt %;
(d) a cross-linking agent, accounting for 5-20 wt %; and
(e) a composite crosslink initiator, accounting for 0.1-3 wt %.

Another objective of the present invention is to provide a thermosetting polyphenylene ether resin, which contains a thermosetting polyphenylene ether resin with a staggered structure. After cured, it features low dielectric constant (Dk), low dielectric dissipation factor (Df), high glass transition temperature (Tg), high heat resistance, high flame retardancy and good solvent solubility, as well as highly compatible to other resins, fully exhibiting the advantages of the thermosetting polyphenylene ether resin composition. The curable composition at 1 GHz has electric properties such as a dielectric constant (Dk) smaller than 3.0 and dielectric dissipation factor (Df) smaller than 0.0020, and it also has a glass transition temperature (Tg) higher than 210° C. and resistance to 288° C. solder heat for more than 600 seconds.

The disclosed thermosetting resin composition of the present invention has good processability, and is highly soluble to solvents and highly compatible to epoxy resins. It can be used in semi-cured resin sheet (or B-stage prepreg) and cured resin sheet (or prepreg) for making printed circuit boards, or it can be used to impregnate fiberglass cloth that is laminated with copper foil into copper clad laminates or copper foil substrates for use in high-frequency printed circuit boards.

The disclosed thermosetting resin composition of the present invention provides the following beneficial effects:
1. it is suitable for low-temperature laminating processes:
2. when used to impregnate prepreg, it has proper rigidity and high cutting ability, so the frequency of changing tool during manufacturing can be decreased and the related cost can be reduced; and copper clad laminates or copper foil substrates
3. when used in copper clad laminates or copper foil substrates and cured, it has better rigidity, making it suitable for applications related to multilayer printed circuit boards, such as servers.

DETAILED DESCRIPTION OF THE INVENTION

The present invention discloses a thermosetting resin composition using a thermosetting polyphenylene ether resin as its primary resin. The thermosetting polyphenylene ether resin is formed form mixing a polyphenylene ether thermally modified with styrene (hereinafter referred to as a styrene-type polyphenylene ether resin) with a polyphenylene ether thermally modified with acrylic (hereinafter referred to as an acrylic-type polyphenylene ether resin) at a certain weight ratio.

Therein, the styrene-type polyphenylene ether has a chemical structural formula (A) as followed:

structural formula (A)

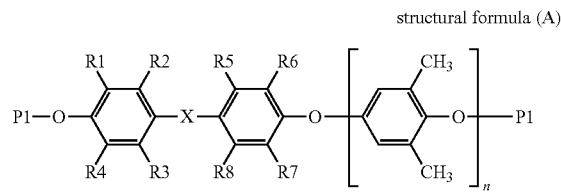

where
R1-R8 each are one or more selected from the group consisting of an ally group, hydryl group and a C1-C6 alkyl group;
X is O (an oxygen atom),

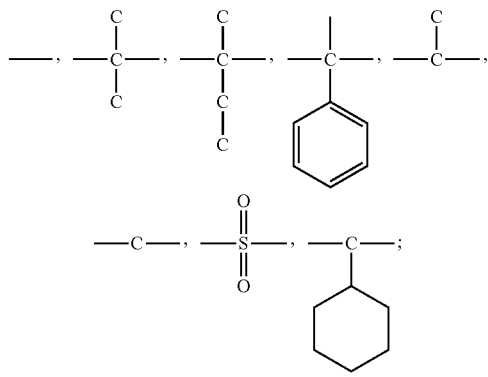

P1 is a styryl group (phenylethene) or

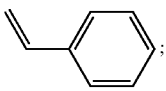

n is an integer of from 1 to 99.

The acrylic-type polyphenylene ether has a chemical structural formula (B) as followed:

structural formula (B)

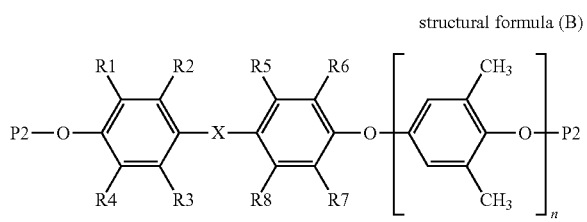

where
R1-R8 each are one or more selected from the group consisting of an allyl group, a hydryl group and a C1-C6 alkyl group;
X is O (an oxygen atom);

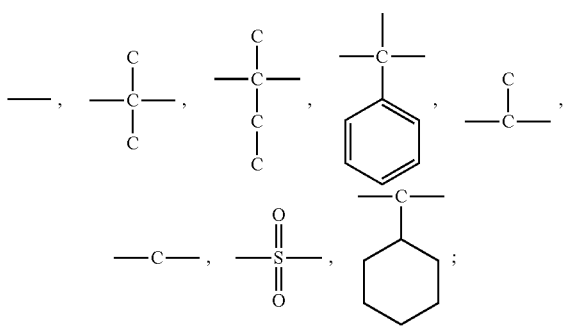

P2 is

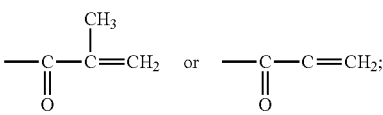

n is an integer of from 1 to 99.

The disclosed thermosetting polyphenylene ether resin may be produced in two ways, but not limited to these two ways.

The first way involves process for producing the thermosetting polyphenylene ether resin by oxidation polymerization. Particularly, 2,6-dimethylphenol (2,6-DMP) and oxygen (O2) or air, in the presence of an organic solvent as well as a coordination complex catalyst formed by copper and amines, are subject to C—O oxidation polymerization. In addition, 2,6-DMP may be subject to co-polymerization with phenols having functional groups for modification. The polyphenylene ether resin obtained through oxidation polymerization still has a certain amount of hydroxyl groups at the end of its molecular chain. Thus it is possible to further add different reactive functional groups through a terminally-grafting reaction.

The second way involves process for producing the thermosetting polyphenylene ether resin by pyrolysis reaction. The second way is to use pyrolysis of phenols and peroxides to decompose unfunctionalized polyphenylene ether resin that has a higher molecular weight into a polyphenylene ether having a lower molecular weight. The polyphenylene ether resin obtained through pyrolysis still has a certain amount of hydroxyl groups at the end of its molecular chain. Thus it is possible to further add different reactive functional groups through a terminally-grafting reaction.

Alternatively, another way is that diphenols with different functional groups may be used to endow the polyphenylene ether having a lower molecular weight with different reactive functional groups.

The disclosed thermosetting polyphenylene ether resin of the present invention is made by modifying the hydroxyl groups at the end of the molecular chain of the polyphenylene ether resin through grafting. The graft reaction is based on the principle of nucleophilic substitution. Particularly, the hydroxyl groups at the end of the low molecular polyphenylene ether resin are converted into sodium or potassium salt, thereby forming phenoxide at the end thereof.

Said phenoxide is highly reactive, and reacts with monomers such as halides, halide acids and acid anhydrides. To implement the present invention, in the presence of a phase transfer catalyst, an acid monomer having unsaturated active groups (such as allyl groups and alkynyl groups), such as a halide, a halide acid or an acid anhydride, is introduced as the end-capping graft monomer. After the graft reaction, the residue of the monomer connects the oxygen atoms at the end of the main chain of the polyphenylene ether, so as to form the disclosed thermosetting polyphenylene ether resin of the present invention with a staggered structure.

The disclosed thermosetting resin composition of the present invention, using the disclosed thermosetting polyphenylene ether resin as the primary resin, is composed of the following components (a)-(e):

(a) a thermosetting polyphenylene ether resin, accounting for 35-60 wt % of the total solid content of the resin composition, and formed from mixing a styrene-type polyphenylene ether resin with an acrylic-type polyphenylene ether resin at a weight ratio of the styrene-type polyphenylene ether resin to the acrylic-type polyphenylene ether resin ranged between 0.5 and 1.5, preferably ranging between 0.75 and 1.25;
(b) inorganic powder (or filler), accounting for 20-50 wt % of the total solid content of the resin composition:
(c) a flame retardant, accounting for 5-25 wt % of the total solid content of the resin composition;
(d) a cross-linking agent, accounting for 5-20 wt % of the total solid content of the resin composition:
(e) a composite crosslink initiator, accounting for 0.1-3 wt % of the total solid content of the resin composition.

The styrene-type polyphenylene ether resin in the thermosetting polyphenylene ether resin is a polyphenylene ether resin having an aforesaid chemical structural formula (A); and the acrylic-type polyphenylene ether resin of the thermosetting polyphenylene ether resin is a polyphenylene ether resin having an aforesaid chemical structural formula (B).

The thermosetting polyphenylene ether resin, disclosed in the thermosetting resin composition of the present invention, has a number-average molecular weight (Mn) preferably above 1,000 and below 25,000, and more preferably above 2,000 and below 10,000, so as to obtain desired physical properties, such as higher glass transition temperature (Tg), smaller dielectric constants (Dk), and lower dielectric dissipation factor (Df).

More particularly, the disclosed thermosetting polyphenylene ether resin at its end at least has one or more unsaturated active functional groups. The number of the terminally-grafted functional groups can be determined by measuring the OH valence (or called hydroxyl value). Measurement of the Oil valence is determined according to ASTM E-222 (Test Methods for Hydroxyl Groups by Acetic Anhydride). The method involves preparing a pyridine solution in 25 vol % acetic anhydride, and preparing it into an acetylated reagent. A few grams of the sample to be tested is accurately weighted mixed with 5 mL of the acetylated reagent completely. The mixture is heated to full dissolution, and phenol phthalein is added as an indicator. 0.5N potassium hydroxide solution in ethanol is used for standardization to get the measurement.

The disclosed thermosetting polyphenylene ether resin has an OH valence preferably smaller than 3.0 mgKOH/g, and more preferably smaller than 2.0 mgKOH/g. The minimal of the OH valence is 0.001 mgKOH/g so as to ensure there are sufficient functional groups for reaction and in turn ensure good physical properties such as glass transition temperature (Tg) and heat resistance. When the OH valence is greater than 10.0 mgKOH/g, it means that the number of the terminally-grafted functional groups is not enough, and the physical properties such as glass transition temperature (Tg) and heat resistance after cured will fail the expectation, and can lead to board popcorn when used to produce copper clad laminates.

The lower the OH valence of the disclosed thermosetting polyphenylene ether resin is, the more functional groups in the polyphenylene ether resin are available for reaction, so that lower press temperature, for example 150-200° C., can be used to achieve desired physical properties.

The inorganic powders, being filled in the disclosed thermosetting resin composition of the present invention, serve mainly to improve the mechanical strength and dimension stability of the thermosetting resin composition in the hardened state.

The ingredient/ingredients of the inorganic powder is/are one or more selected from the group consisting of: spherical or irregular silicon dioxide ($SiO_2$), titanium dioxide ($TiO_2$), aluminum hydroxide ($Al(OH)_3$), aluminum oxide ($Al_2O_3$), magnesium hydroxide ($Mg(OH)_2$), magnesium oxide (MgO), calcium carbonate ($CaCO_3$), boron trioxide ($B_2O_3$), calcium oxide (CaO), strontium titanate ($SrTiO_3$), barium titanate ($BaTiO_3$), calcium titanate ($CaTiO_3$), magnesium titanate ($2MgO.TiO_2$), cerium(IV) oxide ($CeO_2$) and fumed silica particles.

The average particle size of the inorganic powder preferably ranges from 0.01 to 20 μm. Fumed silica is porous nano-sized silica particles, with an average particle size of 1-100 nm, and can be added at 0.1-10 wt %. If the percentage of fumed silica exceeds 10 wt %, the viscosity of the thermosetting resin, composition will be increased, making the composition difficult to work with. Silicon dioxide ($SiO_2$), on the other hand, can be added in a molten or crystalline state. Considering the dielectric properties of the composition, molten silicon dioxide such as 525ARI of Sibelco Bao Lin is preferred.

The flame retardant used for the thermosetting resin composition of the present invention is selected from brominated flame retardants and phosphorus flame retardants. Therein, A suitable brominated flame series retardant may be one or more selected from the group consisting of Saytex BT 93W (N,N-ethylene-bis(tetrabromophthalimide)), Saytex 120 (tetradecabromodiphenoxy benzene), Saytex 8010 (1,2-bis(pentabromophenyl) ethane) and Saytex 102 (decabromodiphenyl oxide), supplied by Albemarle Corporation, USA.

Suitable phosphorus flame retardant(s) may be one or more selected from the group consisting of phosphate esters, phosphazenes, ammonium polyphosphates, melamine polyphosphates, melamine cyanurates, aluminum-containing secondary phosphates, and DOPO-based flame retardants.

The phosphate esters flame retardant is one or more selected from the group consisting of triphenyl phosphate (TPP), resorcinol tetraphenyl diphosphate (RDP), bisphenol A bis (diphenyl) phosphonates (BPAPP), bisphenol A bis (methyl) phosphonates (BBC), resorcinol bis(diphenyl phosphate) and tetrakis(2,6-dimethylphenyl) 1,3-phenylene bisphosphate.

The resorcinol bis(diphenyl phosphate) may be obtained from Daihachi Chemical Industry Co., Ltd. (Japan) under the trade name CR-733S; and the tetrakis(2,6-dimethylphenyl) 1,3-phenylene bisphosphate may be obtained from Daihachi Chemical Industry Co., Ltd. (Japan) under the trade name PX-200.

The phosphazene flame retardant may be poly(diphenoxy) phosphazene, available from trade name phosphazene SPB-100, Otsuka Pharmaceuticals Co., Ltd., Japan.

The aluminum-containing secondary phosphates flame retardant may be commercially available from Clariant Corporation marketed under the brands Exolit OP 935, having a chemical structural formula (F):

structural formula (F)

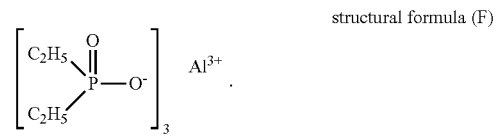

The DOPO-based flame retardant is one or more selected from DOPO (having a chemical structural formula (C)), DOPO-HQ (having a chemical structural formula (D)), and dual DOPO derivative structure (having a chemical structural formula (E)).

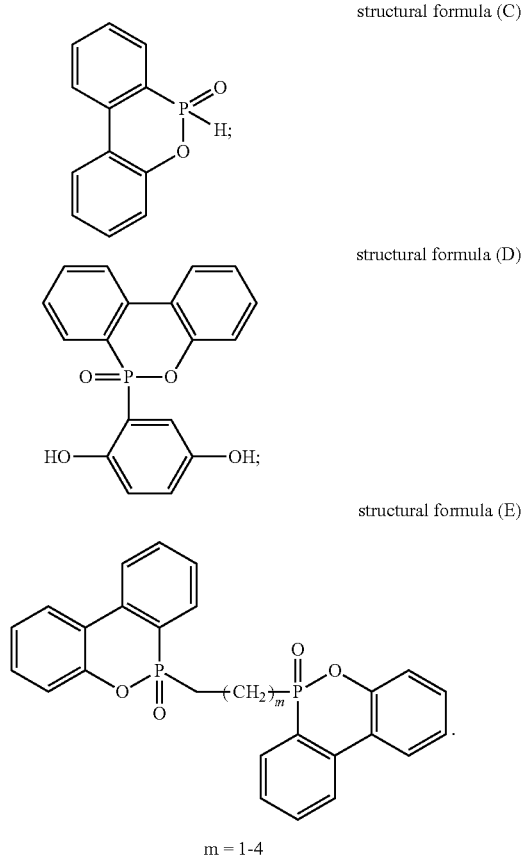

structural formula (C)

structural formula (D)

structural formula (E)

m = 1-4

The polyphenylene ether resin has a glass transition temperature higher when added with a brominated flame retardant than when added with a phosphorus flame retardant.

In the thermosetting resin composition of the present invention, the cross-linking agent is used to increase the cross-linking level of the thermosetting resin, and adjust the matrix in terms of rigidity, toughness and processability. The cross-linking agent is one or more selected from the group consisting of triallyl cyanurate (TAC), triallyl isocyanurate (TAIC), trimethallyl isocyanurate (TMAIC), diallyl phthalate, divinylbenzene, and 1,2,4-triallyl trimellitate.

The composite crosslink initiator for use in the thermosetting resin composition of the present invention is a kind of organic peroxide, for speeding up crosslinking at different temperatures. When the thermosetting resin composition of the present invention is heated, at a certain temperature, the initiator decomposes and generates free radicals to help for triggering radical crosslinking polymerization. As the temperature raises, the peroxide is consumed in an, increased speed. Therefore, matching between the peroxide and the resin composition comes to concern. If the peroxide decomposes at a temperature lower than where the activation energy of polymerization forms, the resulting cross-linking level will be insufficient.

The disclosed thermosetting resin composition of, the present invention uses the styrene-type polyphenylene ether resin and the acrylic-type polyphenylene ether resin that are mixed in a certain weight ratio. As the levels of activation energy for the styryl group and for the acrylic group are different, a composite crosslink initiator is required to initiate the reaction for the optimal physical properties. When the initiator is composed according to the weight ratio between the two resins, the best cross-linking level can be achieved.

Among common peroxides, the present invention uses one or more selected from bis(1,1-dimethylpropyl) peroxide, di-tert-butyl peroxide, dicumyl peroxide (DCP), dibenzoyl peroxide (BPO); cumyl hydroperoxide 1,3-bis(tert-butylperoxy-isopropyl)benzene, bis(tert-butyldioxyisopropyl)benzene, 2,5-dimethyl-2,5-di(tert-butylperoxy)hexane, 2,5-di(tert-butylperoxy)-2,5-dimethyl-3-hexyne, and 1,1-di-(tert-butylperoxy)-3,3,5-trimethylcyclohexane.

The composite crosslink initiator used in the present invention is made by combining multiple crosslink initiator based on the 1 hour half-life temperature of the peroxide, so that throughout the heat curing process of the disclosed thermosetting resin composition, the composite crosslink initiator initiate multiple crosslink reactions at different temperature phrases, making the resin composition have more complete crosslink, thereby getting better heat resistance and physical properties.

The disclosed composite crosslink initiator preferably has a proportion of active oxygen greater than 5% in the peroxide, being one or more selected from dicumyl peroxide (active oxygen: 5.86%, 1 hour half-life temperature: 137° C.), bis(tert-butyldioxyisopropyl)benzene (active oxygen: 9.17%, 1 hour half-life temperature: 139° C.), 2,5-dimethyl-2,5-di(tert-butylperoxy)hexane (active oxygen: 10.25%, 1 hour half-life temperature: 140° C.), di-tert-pentyl peroxide (active oxygen: 8.81%, 1 hour half-life temperature: 143° C.), di-tert-butyl peroxide (active oxygen: 10.78%, 1 hour half-life temperature: 149° C.), and cumyl hydroperoxide (active oxygen: 9.14%, 1 hour half-life temperature: 188° C.), preferably being a combination of bis(tert-butyldioxyisopropyl)benzene and cumyl hydroperoxide mixed with a weight ratio according to the same weight ratio between the two modified polyphenylene ether resins of the thermosetting polyphenylene ether resin, for optimal physical properties of the cured product, such as glass transition temperature and rigidity.

In addition, the disclosed thermosetting resin composition of the present invention may have a coupling agent added therein to improve interfacial affinity between the inorganic powder resins. The coupling agent may be directly added into the resin mixture, or may be used by processing the inorganic powder with the coupling agent first and then using the processed powder to make the resin mixture of the present invention.

The disclosed thermosetting resin composition of the present invention can be used to impregnate reinforcement to form prepregs and cured products. Therein, the prepreg is a composite material made by impregnating the reinforcement with the thermosetting resin composition of the present invention at an ambient temperature between 15 and 40° C.

A prepreg of the present invention includes a reinforcing material at 10-50 wt % and the disclosed thermosetting resin composition of the present invention with which the reinforcing material is impregnated at 50-90 wt %, by weight of the prepreg. The reinforcing material can be selected from glass cloth, non-woven glass cloth, organic fiber cloth, non-woven organic fiber cloth, paper, non-woven liquid crystal polymer cloth, synthetic fiber cloth, carbon fiber cloth, PP cloth PTFE cloth, and non-woven fabric.

The prepregs of the present invention, after dried at 100-140° C., are formed into semi-cured resin sheets (or B-stage prepreg) and cured sheets to be used in high-performance printed circuit boards. When fiberglass cloth is used as the reinforcement, the resulting fiberglass cloth prepregs can be sandwiched by upper and lower pieces of copper foil to make copper clad laminates or copper foil substrates for use in high-frequency printed circuit boards.

To make the copper clad laminate using continuous automated production, one or two or more prepregs of the present invention are layered between two pieces of 35 µm copper foil, and pressed with a pressure of 25 kg/cm² following a temperature profile of being held at 85° C. for 20 minutes, heated in a rate of 3° C./min to range between 150° C. and 190° C., held, at 120 minutes, and gradually cooled to 130° C., so as to obtain copper clad laminates having a thickness of 0.8 mm or more.

The disclosed thermosetting resin composition of the present invention uses the foregoing thermosetting polyphenylene ether resin with a staggered structure, and after cured shows low dielectric constant (Dk), low dielectric dissipation factor (Df), high glass transition temperature (Tg), high heat resistance, high flame retardancy and good solvent solubility, as well as highly compatible to other resins, fully exhibiting the advantages of the thermosetting polyphenylene ether resin. The fiberglass cloth prepregs of the present invention can be laminated with copper foil to form copper clad laminates for high-performance printed circuit boards.

The following examples and comparative examples are described for illustrating the effects of the present invention, but not intended to limit the scope of the present invention.

The physical properties of the copper toil substrates made in the embodiments and the comparative examples were evaluated by the methods listed below:

1. Measurement of glass transition temperature (Tg, ° C.):
    A Dynamic Mechanical Analyzer (Model: DMA 2980, available: from TA Instruments, U.S.A.) is used to determine the glass transition temperatures of the laminate and PPE.
2. Analysis of water absorbency (%):
    Water is heated in a 2 atm pressure cooker to 120° C. A specimen is placed in the pressure cooker for 30 minutes. The specimen's Weight variation regarding before and after water absorption is recorded.
3. Analysis of 288° C. soldering heat resistance (unit: second):
    A specimen is heated in a pressure cooker for 120 minutes at 120° C., 2 atm, and then immersed into a solder furnace at 288° C. The time it takes for the specimen to be delaminated is recorded.
4. Test for copper foil's peel strength (lb/in):
    In accordance with IPC-TM-650 Method 2.4.8C to test and determine peel strength between copper foil and the circuit substrate.
5. Test for Dielectric constant Dk (1 GHz):
    A dielectric Analyzer (Model: HP Agilent E4991 A, available from Agilent Technologies Inc.) is used to test for dielectric constant Dk at 1 GHz.
6. Test for dielectric dissipation factor Df (1 GHz):
    A dielectric Analyzer (Model: HP Agilent E4991A, available from Agilent Technologies Inc.) is used to test for dielectric dissipation factor Df at 1 GHz.
7. Measurement of PPE resin's molecular weight:
    A given amount of PPE resin dissolves in a tetrahydrofuran (THF) solvent to form a 1% solution. The solution is heated to become clear for GPC (gel permeation chromatography) analysis. The PPE resin molecular weight is determined by calculating its character peak area. A calibration line for analysis is established by marking multiple points on standard polystyrene products with different molecular weights. After the calibration line is established, the molecular weights of the tested sample to be measured can be determined.
8. Test Method for Hydroxyl Value (or Oil valence):
    In accordance with ASTM E 222 test methods for hydroxyl groups by acetic anhydride. By hydroxyl anhydride-pyridine method, a pyridine solution containing 25 vol % acetic anhydride is prepared as an acetylation reagent. A few grams of a sample to be tested is precisely weighed and mixed thoroughly with 5 mL of the acetylation reagent. The mixture is heated until the sample is completely dissolved, and phenolphthalein is added into the mixture as an indicator. Titration is then carried out with an ethanol solution of 0.5-N potassium hydroxide.
9. Rigidity:
    This is determined with a DMA and expressed by the G' value (storage modulus, GPa) at 50° C.

Examples 1-8, Comparative Examples 1-6

The thermosetting resin compositions shown in Table 1 were mixed with toluene to form varnish products. These varnish products were used to impregnate Nan Ya's fiberglass cloth (Nan Ya Plastics Corporation, Taiwan, cloth model no. 7628) at room temperature. The impregnated cloth was, dried at 110° C. (in an impregnating machine) for several minutes to yield prepregs having a resin content of 4.3 wt %. At last, four prepregs were layered between two pieces of 35 µm copper foil, and pressed with a pressure of 25 kg/cm² following a temperature profile of being held at 85° C. for 20 minutes, heated in a rate of 3° C./min to 185° C., held at 120 minutes, and gradually cooled to 130° C., so as to obtain 0.8 mm copper clad laminates.

The copper clad laminate so made was tested for physical properties, and the results are shown in Table 1.

Results:

By comparing the test results of Examples 1-8 and Comparatives Example, 1-6 as listed in Table 1, it is learned that:

1. The circuit substrates of Examples 1-8 all showed good dielectric constant (Dk) and dielectric dissipation factor (Df). Each of them had its dielectric constant (Dk) smaller than 3.0 and dielectric dissipation factor (Df) smaller than 0.0020, while the glass transition temperatures (Tg) were all higher than 205° C.
    Other physical properties such as copper foil's peel strength, water absorbency, resistance, to 288'C solder heat, and flame retardancy were all good, and their ease of prepreg cutting was particularly.
2. Comparative Example 1 used the polyphenylene ether having a terminal acrylic group, and showed low rigidity, low glass transition temperatures (Tg) and poor heat resistance.
    Comparative Example 2 used the polyphenylene ether having a terminal styryl group, and showed good physical properties.
    The differences lay on the end groups they have. The acrylic group is of a soft structure, having poor heat resistance but good flowability. The styryl group is structurally stable and rigid, having good heat resistance but low flowability.

3. Examples 1-3 mixed the polyphenylene ether having a terminal acrylic group and the polyphenylene ether having a terminal styryl group in different weight ratios and primary resins, and adopted composite crosslink initiators, and got acceptable heat resistance results.
4. In Examples 2, 4 and 5, DOPO-type flame retardants of different structures were used with the acrylic-based polyphenylene ether or the styrene-based polyphenylene ether and a composite crosslink initiator, and the resulting heat resistance, and electric properties were all acceptable.
5. Example 6 adopted the brominated flame retardant, which resulted that a glass transition temperatures (Tg) being higher than the phosphorus flame retardant could cause.
6. Comparative Examples 5-6 each used a single crosslink initiator. Since they used two polyphenylene ether resins having different end groups, the levels of activation energy required for curing were different, and the low cross-linking level caused by the reaction had adverse effects on glass transition temperatures (Tg) and heat resistance.
7. Comparative Example 3 used the polyphenylene ether resin terminated with an OH group. Since its end was not functionalized, the OH valence was as high as 47 mgKOH/g, making the cured composition have low glass transition temperature (Tg) and poor heat resistance. The laminate showed low peel strength and high dielectric constant as well as dielectric dissipation factor greater than 0.0035.
8. In Comparative Example 4, the additionally used polybutadiene resin decreased dielectric constant (Dk) and dielectric dissipation factor (Df), but since the polybutadiene resin is in nature less resistant to heat and flammable, the resulting composition has poor flame retardancy and low glass transition temperature (Tg).

TABLE 1

Prepreg and substrates' physical properties

| | Composition (by weight %) | Examples | | | | | | | |
|---|---|---|---|---|---|---|---|---|---|
| | | 1 | 2 | 3 | 4 | 5 | 6 | 7 | 8 |
| PPE resin | PPE-A (terminal styryl group)[1] | 20 | 25 | 30 | 25 | 25 | 25 | 20 | 21 |
| | PPE-B (terminal acryl group)[2] | 30 | 25 | 20 | 25 | 25 | 25 | 40 | 14 |
| | PPE-C (terminal hydroxyl group) | — | — | — | — | — | — | — | — |
| | OH valence[3] | 0.01 | 0.02 | 0.02 | 0.02 | 0.02 | 0.02 | 0.02 | 0.02 |
| | PPE resin's molecular weight[4] | 2369 | 2564 | 2624 | 2564 | 2564 | 2564 | 2564 | 2564 |
| | Polybutadiene resin | — | — | — | — | — | — | — | — |
| Crosslinking agent | TAIC | 9.2 | 9.2 | 9.2 | 9.2 | 9.2 | 5 | 14.9 | 7 |
| Flame retardant | BT-93 | — | — | — | — | — | 19 | — | — |
| | OP-935[5] (formula F) | 6 | 6 | 6 | 6 | 6 | — | 5 | 13 |
| | DOPO[6] (formula E) | 9 | 9 | 9 | — | — | — | — | 12 |
| | DOPO[6] (formula D) | — | — | — | 9 | — | — | — | — |
| | DOPO[6] (formula C) | — | — | — | — | 9 | — | — | — |
| Filler | SiO$_2$ | 25 | 25 | 25 | 25 | 25 | 25 | 20 | 30 |
| Initiator | 1,4-bis-(2-tert-butylperoxy isopropyl)benzene | 0.32 | 0.4 | 0.48 | 0.4 | 0.4 | 0.5 | 0.04 | 1.8 |
| | cumyl hydroperoxide | 0.48 | 0.4 | 0.32 | 0.4 | 0.4 | 0.5 | 0.08 | 1.2 |
| | Glass transition temperature (° C.) (DMA)[7] | 214 | 218 | 221 | 210 | 211 | 232 | 219 | 220 |
| | Water absorbency (%)[8] | 0.03 | 0.02 | 0.02 | 0.03 | 0.03 | 0.02 | 0.02 | 0.02 |
| | Resistance to 288° C. solder heat (second)[9] | 600 above | | | | | | | |
| | Copper foil's peel strength (lb/in) | 5.36 | 5.68 | 5.86 | 5.68 | 5.75 | 5.95 | | |
| | Rigidity (storage modulus at 50° C., GPa)[10] | 12.8 | 14.5 | 15.9 | 14.6 | 14.7 | 13.8 | 10.9 | 17.2 |
| Substrate[11] | Dielectric constant Dk | 2.89 | 2.90 | 2.88 | 2.93 | 2.88 | 2.86 | 2.90 | 2.89 |
| | dielectric dissipation factor Df (×10−3) | 1.9 | 1.8 | 1.8 | 1.9 | 1.8 | 1.6 | 1.9 | 1.8 |
| | Flame retardancy (UL-94) | V0 | V0 | V0 | V0 | V0 | V0 | V0 | V0 |
| | Ease of prepreg cutting[12] | good | good | good | good | good | good | good | good |

| | Composition (by weight %) | Comparative Examples | | | | | |
|---|---|---|---|---|---|---|---|
| | | 1 | 2 | 3 | 4 | 5 | 6 |
| PPE resin | PPE-A (terminal styryl group)[1] | — | 50 | — | 25 | 25 | 25 |
| | PPE-B (terminal acryl group)[2] | 50 | — | — | — | 25 | 25 |
| | PPE-C (terminal hydroxyl group) | — | — | 50 | — | — | — |
| | OH valence[3] | 0.01 | 0.02 | 47 | 0.02 | 0.02 | 0.02 |
| | PPE resin's molecular weight[4] | 2266 | 2761 | 2052 | 2761 | 2564 | 2564 |
| | Polybutadiene resin | — | — | — | 25 | — | — |
| Crosslinking agent | TAIC | 9.2 | 9.2 | 9.2 | 9.2 | 9.2 | 9.2 |
| Flame retardant | BT-93 | — | — | — | — | — | — |
| | OP-935[5] (formula F) | 6 | 6 | 6 | 6 | 6 | 6 |
| | DOPO[6] (formula E) | 9 | 9 | 9 | 9 | 9 | 9 |
| | DOPO[6] (formula D) | — | — | — | — | — | — |
| | DOPO[6] (formula C) | — | — | — | — | — | — |
| Filler | SiO$_2$ | 25 | 25 | 25 | 25 | 25 | 25 |
| Initiator | 1,4-bis-(2-tert-butylperoxy isopropyl)benzene | 0.4 | 0.4 | 0.4 | 0.4 | 0.8 | — |
| | cumyl hydroperoxide | 0.4 | 0.4 | 0.4 | 0.4 | — | 0.8 |
| | Glass transition temperature (° C.) (DMA)[7] | 191 | 226 | 183 | 195 | 208 | 202 |
| | Water absorbency (%)[8] | 0.03 | 0.02 | 0.11 | 0.03 | 0.03 | 0.04 |

TABLE 1-continued

| Prepreg and substrates' physical properties | | | | | | | |
|---|---|---|---|---|---|---|---|
| | Resistance to 288° C. solder heat (second)[9] | 552 | 600 | 205 | 462 | 485 | 400 |
| | Copper foil's peel strength (lb/in) | 4.86 | 5.52 | 3.35 | 3.89 | 4.05 | 4.12 |
| | Rigidity (storage modulus at 50° C., GPa)[10] | 10.6 | 16.8 | 8.8 | 9.2 | 10.8 | 10.3 |
| Substrate[11] | Dielectric constant Dk | 3.14 | 3.13 | 3.38 | 3.02 | 3.12 | 3.16 |
| | dielectric dissipation factor Df (×10−3) | 2.1 | 2.1 | 3.7 | 1.7 | 2.5 | 2.7 |
| | Flame retardancy (UL-94) | V0 | V0 | NG | NG | NG | NG |
| | Ease of prepreg cutting[12] | good | good | good | poor | good | good |

Remark:

1. PPE-A stands for a styrene-type polyphenylene ether being terminally modified by styrene, having a chemical structural as follows:

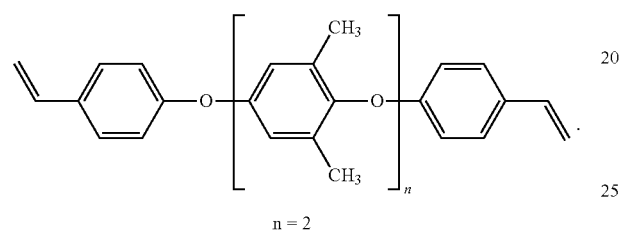

n = 2

2. PPE-B stands for an acrylic-type; polyphenylene ether resin being terminally modified by acrylic, having a chemical structural as follows:

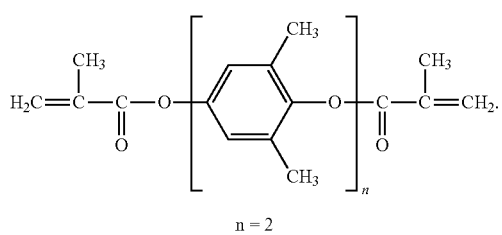

n = 2

3. OH valence of a sample is measured in accordance with ASTM E 222 test methods for hydroxyl groups by acetic anhydride.
4. PPE resin's molecular weight of a sample is measured by the aforesaid evaluation methods described above.
5. OP-935 flame retardant has a chemical structural formula (F)

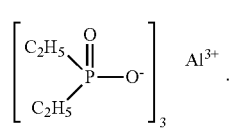

structural formula (F)

6. DOPO flame retardant has a chemical structural formula (C)

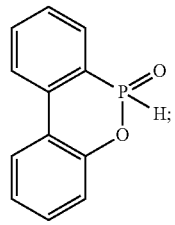

structural formula (C)

DOPO-HQ flame retardant has a chemical structural formula (D)

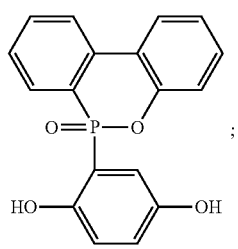

structural formula (D)

dual DOPO derivative structure flame retardant has a chemical structural formula (E)

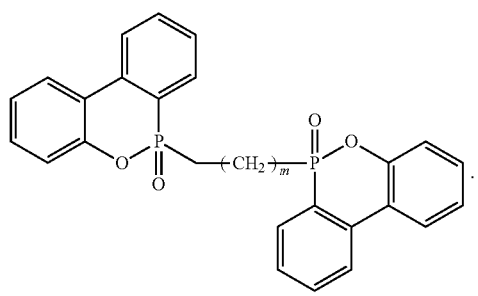

structural formula (E)

m = 2

7. Glass transition temperature is determined with a dynamic mechanical analyzer (DMA) to decide what temperature gets the maximum value of tan δ.
8. Water absorbency (%) of a sample is weighed before and after it is heated in a 120° C., 2-atm pressure cooker for 120 minutes. Then, the change of weight is calculated.
9. Resistance to 288° C. solder heat (seconds) of a sample is heated in a 120° C., 2-atm pressure cooker for 120 minutes and then immersed in a 288° C. soldering furnace. The time it takes for the sample to delaminate is recorded.
10. Rigidity of a sample is determined with a DMA and expressed by the G' value (storage modulus, GPa) at 50'C.
11. Substrate is prepreg hardenable to laminate with one or more copper foil as a substrate.
12. The test result to decide whether a prepreg is ease of cutting is ranked into thee levels including "good" standing for cutting regularly; "fair" standing for cutting irregularly and "poor" standing for cutting hardly.

What is claimed is:
1. A thermosetting resin composition, comprising:
(a) a thermosetting polyphenylene ether resin, accounting for 35-60 wt %, having a number-average molecular weight (Mn) ranging between 1,000 and 25,000, said thermosetting polyphenylene ether resin being formed as a mixture of a styrene-type polyphenylene ether resin with an acrylic-type polyphenylene ether resin at a weight ratio of the styrene-type polyphenylene ether resin to the acrylic-type polyphenylene ether resin ranged from 0.5 to 1.5; wherein the styrene-type polyphenylene ether being terminally modified by styrene has a chemical structural formula (A); and the acrylic-type polyphenylene ether resin being terminally modified by acrylic has a chemical structural formula (B);

structural formula (A)

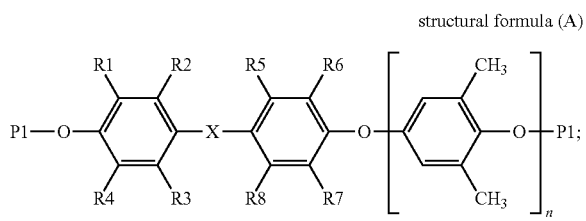

structural formula (B)

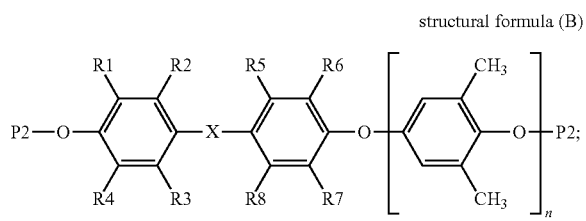

where, R1-R8 each are one or more selected from the group consisting of an allyl group, a hydryl group, and a C1-C6 alkyl group;
X is O (an oxygen atom),

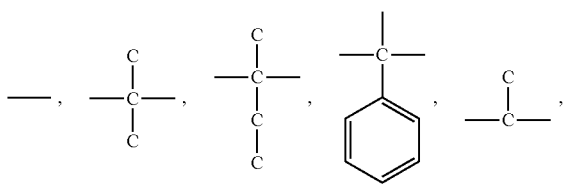

-continued

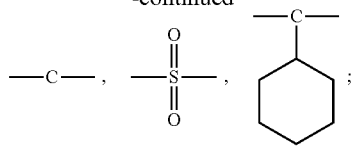

P1 is a styryl group;
P2 is

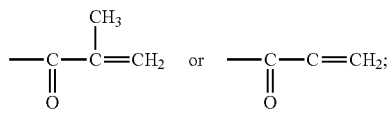

n is an integer of from 1 to 99;
(b) inorganic powder accounting for 20-50 wt %;
(c) a flame retardant accounting for 5-25 wt %;
(d) a cross-linking agent accounting for 5-20 wt %; and
(e) a composite crosslink initiatory accounting for 0.1-3 wt %; wherein said composite crosslink initiator includes a combination of bis(tert-butyldioxyisopropyl)benzene and cumyl hydroperoxide.

2. The thermosetting resin composition of claim 1, wherein the thermosetting polyphenylene ether resin has the number-average molecular weight (Mn) ranging between 2,000 and 10,000.

3. The thermosetting resin composition of claim 1, wherein the thermosetting polyphenylene ether resin has an OH valence smaller than 3.0 mgKOH/g.

4. The thermosetting resin composition of claim 1, wherein weight ratio of the styrene-type polyphenylene ether resin to the acrylic-type polyphenylene ether resin ranged from 0.75 to 1.25.

5. The thermosetting resin composition of claim 1, wherein the flame retardant is one or two selected from the group consisting of N,N-ethylene-bis(tetrabromophthalimide), tetradecabromodiphenoxy benzene, 1,2-bis(pentabromophenyl) ethane and decabromodiphenyl oxide.

6. The thermosetting resin composition of claim 1, wherein the inorganic powder is one or more selected from the group consisting of silicon dioxide (SiO$_2$), titanium dioxide (TiO$_2$), aluminum hydroxide (Al(OH)$_3$), aluminum oxide (Al$_2$O$_3$), magnesium hydroxide (Mg(OH)$_2$), magnesium oxide (MgO), calcium, carbonate (CaCO$_3$), boron trioxide (B$_2$O$_3$), calcium oxide (CaO), strontium titanate (SrTiO$_3$), barium titanate (BaTiO$_3$), calcium titanate (CaTiO$_3$), magnesium titanate (2MgO.TiO$_2$), cerium(IV) oxide (CeO$_2$) and fumed silica particle.

7. The thermosetting resin composition of claim 1, wherein the cross-linking agent is one or more selected from the group consisting of triallyl cyanurate (TAC), triallyl isocyanurate (TAIC), trimethallyl isocyanurate (TMAIC), diallyl phthalate, divinylbenzene, and 1,2,4-triallyl trimellitate.

8. The thermosetting resin composition of claim 1, wherein the flame retardant is one or more selected from the group consisting of phosphate esters, phosphazenes, ammonium polyphosphates, melamine polyphosphates, melamine cyanurates, aluminum-containing secondary phosphates, and DOPO-based flame retardants.

9. The thermosetting resin composition of claim 8, wherein the phosphate esters flame retardant is one or more selected from the group consisting of triphenyl phosphate (TPP), resorcinol tetraphenyl diphosphate (RDP), bisphenol A bis (diphenyl) phosphonates (BPAPP), bisphenol A bis (methyl) phosphonates (BBC), resorcinol bis(diphenyl phosphate) and tetrakis(2,6-dimethylphenyl) 1,3-phenylene bisphosphate.

10. The thermosetting resin composition of claim 8, wherein the aluminum-containing secondary phosphate flame retardant, has a chemical structural formula (F):

structural formula (F)

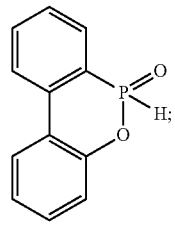

11. The thermosetting resin composition of claim 8, wherein the DOPO-based flame retardant is one or more selected from DODO having a chemical structural formula (C), DOPO-HQ having a chemical structural formula (D), and dual DOPO derivative structure having a chemical structural formula (E):

structural formula (C)

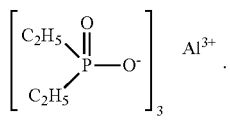

structural formula (D)

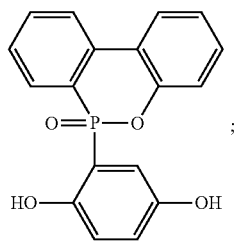

structural formula (E)

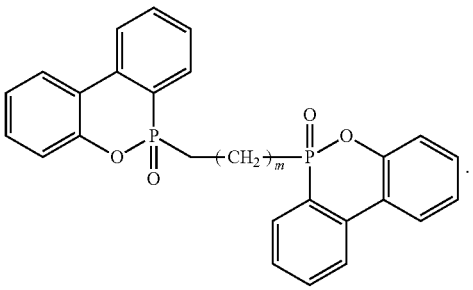

m = 1-4

12. A copper foil substrate for use in making a printed circuit board, containing a prepreg formed from a reinforcing material at 10-50 wt having been impregnated with the thermosetting resin composition of claim 1 at 50-90 wt %, by weight of the prepreg, and having a dielectric constant (Dk) smaller than 3.0 and a dielectric dissipation factor (Df) smaller less than 0.0020 at the frequency of 1 GHz as well as a glass transition temperature (Tg) higher than 210° C.

* * * * *